United States Patent
Hara

(10) Patent No.: US 7,735,717 B2
(45) Date of Patent: Jun. 15, 2010

(54) METHOD OF MANUFACTURING SEMICONDUCTOR APPARATUS AND METHOD OF FORMING VISCOUS LIQUID LAYER

(75) Inventor: Toshiyuki Hara, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 422 days.

(21) Appl. No.: 11/269,552

(22) Filed: Nov. 9, 2005

(65) Prior Publication Data

US 2006/0108399 A1    May 25, 2006

(30) Foreign Application Priority Data

Nov. 22, 2004    (JP)    ............... 2004-338195

(51) Int. Cl.
B23K 1/20    (2006.01)
(52) U.S. Cl. .................................... 228/207
(58) Field of Classification Search ........... 228/207
See application file for complete search history.

(56) References Cited

U.S. PATENT DOCUMENTS

| | | | |
|---|---|---|---|
| 4,934,582 A * | 6/1990 | Bertram et al. ............. 228/191 |
| 5,482,736 A * | 1/1996 | Glenn et al. ................ 427/97.2 |
| 5,928,722 A * | 7/1999 | Soyama et al. ........... 427/207.1 |
| 6,890,384 B2 * | 5/2005 | Moden et al. ............... 118/406 |
| 2003/0035886 A1 * | 2/2003 | Yamuni et al. ................ 427/96 |

FOREIGN PATENT DOCUMENTS

| | | |
|---|---|---|
| JP | 06-124954 | 5/1994 |
| JP | 11-186329 | 7/1999 |
| JP | 2000-216186 | 8/2000 |
| JP | 2002-151536 | 5/2002 |

* cited by examiner

*Primary Examiner*—Jessica L Ward
*Assistant Examiner*—Nicholas P D'Aniello
(74) *Attorney, Agent, or Firm*—Young & Thompson

(57) ABSTRACT

A method of manufacturing a semiconductor apparatus including a process of applying viscous liquid. The method applies viscous liquid onto a principal surface of a substrate, coats the viscous liquid closely with flexible coating material having a higher bonding strength with molecules of the viscous liquid than an intermolecular bonding strength of molecules of the viscous liquid, and then strips away the coating material together with part of the viscous liquid.

7 Claims, 5 Drawing Sheets

METHOD OF MANUFACTURING SEMICONDUCTOR APPARATUS AND METHOD OF FORMING VISCOUS LIQUID LAYER

BACKGROUND OF THE INVENTION

1. Field of the Invention

The present invention relates to a method of manufacturing a semiconductor apparatus and a method of forming a viscous liquid layer that include a process of disposing viscous liquid on a substrate.

2. Description of Related Art

Semiconductor devices used for basic communication equipment, high-end computers and so on face increasing demands for higher speed and higher performance. To meet these demands, it is necessary for the semiconductor devices to achieve higher pin counts and better electrical property. A solution to achieve these objectives is Ball Grid Array (BGA) semiconductor apparatus.

Wire bonding technology that places a chip with its circuit surface facing up and connects it to a terminal with a thin gold wire has been used as a method to electrically connect a semiconductor chip and a packaging substrate. The BGA semiconductor apparatus, on the other hand, uses flip-chip technology that places a semiconductor chip with its circuit surface facing down and connects it to a packaging substrate with a solder or gold terminal (bump) to make electrical connection.

This technology is superior to the wire bonding technology in having better electrical property due to shorter wire length and thus allowing application to higher-speed and higher-density devices. Further, since this technology enables to place pins two-dimensionally under the semiconductor chip, it can achieve higher pin counts of as many as several thousand easily.

In the flip-chip technology, a technique for applying an adequate amount of flux onto a principal surface of a semiconductor chip is extremely important so as to accurately place a bump such as a solder at a predetermined position of a semiconductor chip. Various flux application methods are therefore proposed as described in Japanese Unexamined Patent Publication No. 06-124954 and 11-186329, for example.

FIGS. 4A to 4F are schematic flow charts to describe a method of applying flux onto a semiconductor chip and a method of placing a bump according to a conventional technique.

Flux is viscous liquid that serves to fix solder balls or the like, which are described later, so as to form bumps at accurate positions. As shown in FIG. 4A, a mask 101 that is used when applying flux has a meshed opening 101a that allows flux 103 to pass through the mask 101 perpendicularly to its principal surface. On the principal surface of a semiconductor chip 102 to be coated with the flux 103, given number of electrodes 102a with a diameter of about 100 μm are formed.

Referring first to FIG. 4A, the mask 101 for screen printing is placed on the principal surface of the semiconductor chip 102 having the electrodes.

Referring next to FIG. 4B, the flux 103 is applied onto the surface of the semiconductor chip 102 where the electrodes 102a are exposed by using the mask 101 for screen printing. Specifically, this process places the flux 103 at one end of the mask 101 which is not on the meshed opening 101a and brings it over the mask 101 by using a squeegee 104. It moves the squeegee 104 to the other end of the mask 101 horizontally at a predetermined speed with the edge of the squeegee 104 in contact with the mask at predetermined angle and pressure. The flux 103 is thereby applied onto the semiconductor chip 102 through the meshed opening 101a.

Referring then to FIG. 4C, the mask 101 is removed. The semiconductor chip 102 is thereby coated with the flux having a thickness of about several tens of μm.

Referring then to FIG. 4D, a solder ball 106 is tentatively fixed on the flux 103 by using a ball mounter 107. The diameter of the solder ball 106 is substantially the same as the diameter of the electrode 102a.

Referring finally to FIG. 4E, the solder ball 106 is melted by heat treatment to form a solder bump 108. The heat treatment is performed at a higher temperature than a solder melting temperature. The heat treatment diffuses the component of the flux 103 into the air like water vapor. After the heat treatment, the remaining flux 103 is removed by washing or the like. A series of processes are thereby completed.

Japanese Unexamined Patent Publication No. 06-124954 proposes a technique that applies flux partially on a substrate surface with exposed electrodes by using screen printing. Japanese Unexamined Patent Publication No. 11-186329 proposes a technique that applies an adequate amount of flux by using a roller and a rubber plate.

An adequate amount of flux application thickness varies by the diameter or pitch of solder balls.

If the flux application thickness is larger than an adequate thickness, connection between the solder ball 106 and the electrode 102a can fail due to the thickness of the flux as shown in FIG. 5A. In such a case, the solder ball 106 can be displaced during reflow to make contact with the adjacent solder ball (see FIG. 5A), which causes a bump bridge (see the solder bump 108a in FIG. 5B) and results in short-circuit. Further, if the flux is too much, it can be left in the gap between electrodes or the like after reflow. This raises the need for a longer washing time. If the flux is still left after washing, it hinders resin sealing.

On the other hand, if the flux application thickness is smaller than an adequate thickness, adhesive force is too weak to hold the solder ball 106 at the position of the electrode 102a as shown in FIG. 5C, which causes displacement to occur (see the solder ball 106a in FIG. 5C). If the adjacent solder balls 106 are in contact with each other, it causes a bump bridge and results in short-circuit.

When applying highly viscous flux onto a substrate, however, the primary problem is technical difficulty in applying it thinly rather than controlling the application thickness.

The technique according to Japanese Unexamined Patent Publication No. 06-124954 is expected to reduce the amount of flux to be used since it applies flux only partially. However, the present invention has recognized that this technique requires a mask for screen printing to apply flux partially for each diameter or pitch of solder balls or the like, which increases costs. Further, this technique requires accurate positioning of a mask, thus not suitable for reduction in the diameter or pitch of solder balls. Furthermore, this technique forms a mask to surround flux after applying the flux, and since the mask has low heat resistance, a problem can occur in a process of melting solder bumps. It is thereby difficult to apply this technique in practice.

The present invention has also recognized that the technique according to Japanese Unexamined Patent Publication No. 11-186329 has a problem that the application thickness of flux changes with time due to abrasion of a roller or rubber plate over time. Further, this technique requires large scale equipment.

Though the problems in the flux that is used in the manufacturing process of BGA semiconductor apparatus are described above, similar problems can occur in general viscous liquid to be applied onto a substrate.

SUMMARY OF THE INVENTION

According to an aspect of the present invention, there is provided a method of manufacturing a semiconductor apparatus that disposes viscous liquid on a surface of a substrate, places a flexible material on the viscous liquid which has a higher bonding strength with molecules of the viscous liquid than an intermolecular bonding strength of molecules of the viscous liquid and strips away the flexible material together with part of the viscous liquid.

According to an aspect of the present invention, there is provided a method of forming a viscous liquid layer on a substrate that disposes the viscous liquid on a surface of the substrate, places a flexible material on the viscous liquid which has a higher bonding strength with molecules of the viscous liquid than an intermolecular bonding strength of molecules of the viscous liquid and strips away the flexible material together with part of the viscous liquid.

The present invention allows formation of a viscous liquid film having a desired thickness by applying viscous liquid thicker than a desired thickness onto a substrate, placing a flexible material on the viscous liquid and then stripping it away to reduce the thickness of the viscous liquid. This method enables to deposit a thin film of viscous liquid, which has been difficult in conventional techniques.

The present invention can provide a method of manufacturing a semiconductor apparatus and a method of applying viscous liquid that allow application of a desired thickness of viscous liquid onto a substrate.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 1A:
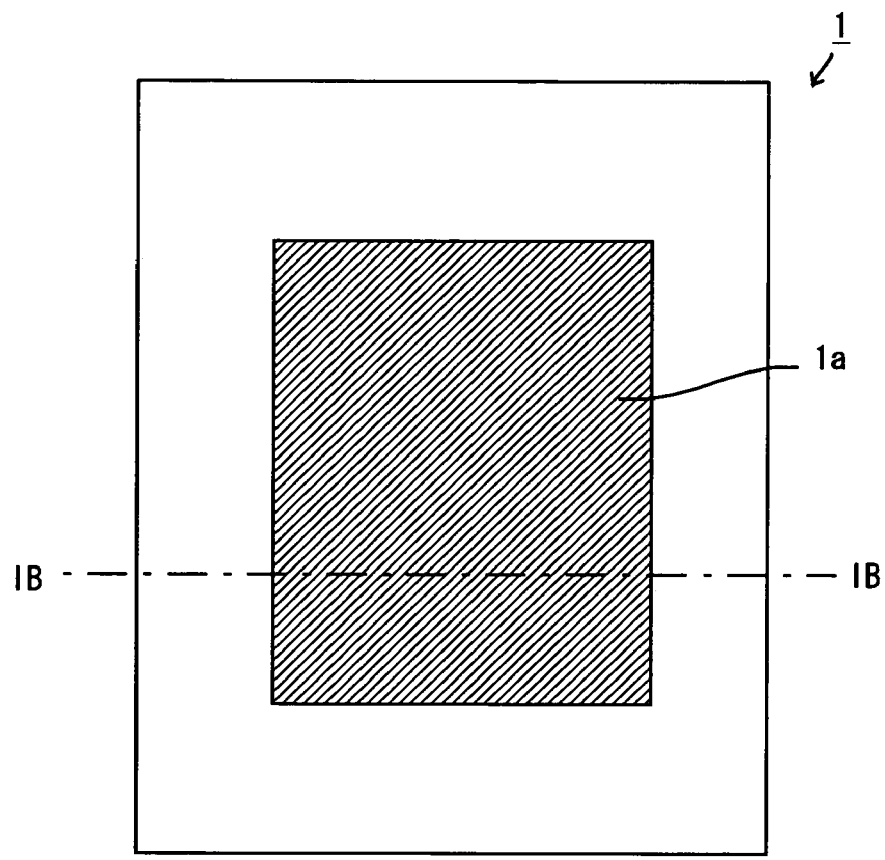
FIG. 1A is a top plan view of a mask.
Figure 1B:
FIG. 1B is a sectional view along line IB-IB of FIG. 1A.

FIG. 1A is a top plan view of a mask 1 for screen printing according to an embodiment of the invention, and FIG. 1B is a sectional view along line IB-IB of FIG. 1A. FIGS. 2A to 2H are schematic process views to describe a method of placing a solder bump on a semiconductor chip of this embodiment.

The mask 1 is made of flexible material and has a meshed opening 1a with substantially the same shape as an area to be coated with flux 3, which is viscous liquid, on a semiconductor chip 2. The flux 3, which is detailed later, passes through the meshed opening 1a in the thickness direction of the mask 1. The flux is composed of viscous liquid and serves to fix a solder ball or the like, which is also detailed later, at an accurate position.

Figure 2A:
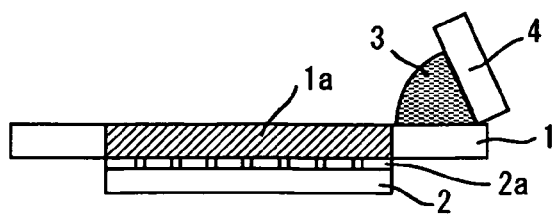
FIG. 2A is a process view to describe a method of applying flux according to an embodiment.

Referring first to FIG. 2A, the mask 1 is placed so that the meshed opening 1a overlaps the position where the electrodes 2a are formed on the semiconductor chip 2. A predetermined number of electrodes 2a each having a diameter of about 100 µm are formed on the semiconductor chip 2. The semiconductor chip 2 and each electrode 2a are fixed to each other with a higher strength than an intermolecular bonding strength of the flux 3. Further, the semiconductor chip 2 is also fixed by vacuum absorption or the like on the backside of the surface where the electrodes 2a are formed so as not to displace from the right position.

Figure 2B:
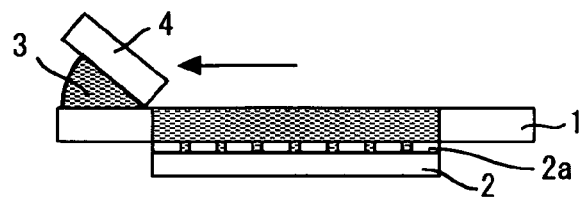
FIG. 2B is a process view to describe a method of applying flux according to an embodiment.

Referring next to FIG. 2B, flux is applied onto the surface of the semiconductor chip 2 where the electrodes 2a are exposed by using the mask 1 for screen printing. Specifically, this process places the flux 3 at one end of the mask 1 which is not on the meshed opening 1a and then spreads it over the mask 1 by using a squeegee 4. It moves the squeegee 4 to the other end of the mask 1 horizontally at a predetermined speed with the edge of the squeegee 4 in contact with the mask at predetermined angle and pressure. The flux 3 is thereby disposed on the semiconductor chip 2 through the meshed opening 1a.

Figure 2C:
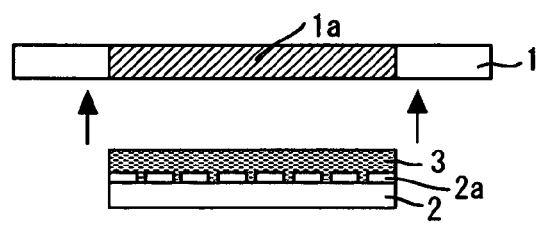
FIG. 2C is a process view to describe a method of applying flux according to an embodiment.

Referring then to FIG. 2C, the mask 1 is separated substantially vertically from the semiconductor chip 2 so that it is removed therefrom. The semiconductor chip 2 is thereby coated with the flux with a thickness of about several tens of µm.

Figure 2D:
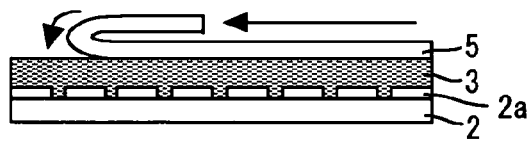
FIG. 2D is a process view to describe a method of applying flux according to an embodiment.

Referring then to FIG. 2D, flexible coating material 5, is placed on the flux 3 in intimate contact from one end to the other end. The flexible coating material 5 may be a sheet that has a higher bonding strength with the molecules of the flux 3 than an intermolecular bonding strength of the molecules of the flux 3, for example. Specifically, a film or sheet of polyethylene, polyvinyl acetate, polyvinyl chloride and so on may be used.

Figure 2E:
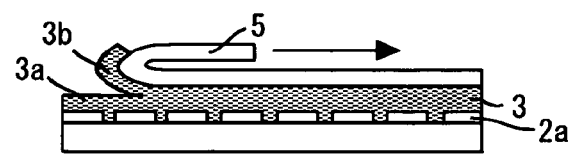
FIG. 2E is a process view to describe a method of applying flux according to an embodiment.

Referring then to FIG. 2E, the coating material 5 is stripped away in a predetermined direction at a predetermined speed. At this time, a certain amount of flux 3b is attached onto the flexible coating material 5. The amount of the flux 3b attached onto the coating material 5 depends on the kind of the coating material and the flux. The thickness of the flux 3a left on the semiconductor chip 2 after stripping away the coating material 5 is thereby equal to the initial application thickness minus the thickness of the flux 3b attached onto the coating material 5. Though it has been difficult to form a thin film by using the screen printing technique, this method is particularly effective for formation of a thin film.

Though the way of stripping the coating material is not particularly limited, it is preferred to strip it at an acute angle or in the substantially horizontal direction with respect to the semiconductor chip 2 rather than stripping it in the vertical direction with respect to the principal surface of the semiconductor chip 2. This prevents the semiconductor chip 2 from moving together with the coating material 5 and also effectively prevents the electrode 2a from being stripped away from the semiconductor chip 2 even when the adhesive force of the flux is higher than the force that fixes the semiconductor chip 2. This embodiment strips the coating material 5 in the substantially horizontal direction with respect to the principal surface of the semiconductor chip 2 from its one end to the other end. After stripping away the coating material 5, the flux 3a remaining on the semiconductor chip 2 is left at rest in a clean room or the like at room temperature for 10 to 20 minutes according to need. This allows the application thickness to be more uniform.

Figure 2F:
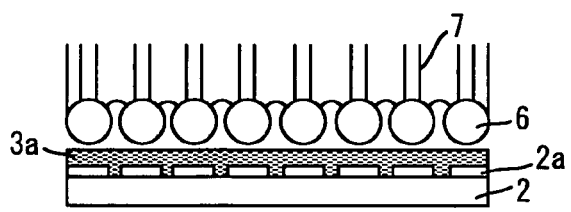
FIG. 2F is a process view to describe a method of applying flux according to an embodiment.
Figure 2G:
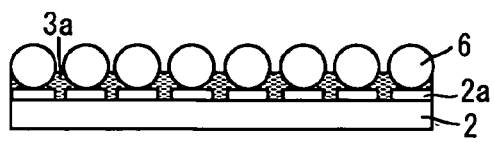
FIG. 2G is a process view to describe a method of applying flux according to an embodiment.

Referring further to FIG. 2F, the solder ball 6 is placed on the flux 3a by using the ball mounter 7. Referring then to FIG. 2G, the solder ball 6 is tentatively fixed so that it faces the electrode 2a through the flux. The diameter of the solder ball 6 is substantially the same as the diameter of the electrode 2a.

Figure 2H:
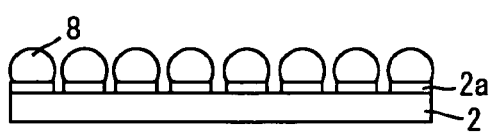
FIG. 2H is a process view to describe a method of applying flux according to an embodiment.

Referring finally to FIG. 2H, the solder ball 6 is melted by heat treatment to form a solder bump 8. The heat treatment is performed at a higher temperature than a solder melting temperature. The heat treatment diffuses the component of the flux 3a into the air like water vapor. After the heat treatment, the remaining flux 3a is removed by washing or the like according to need. A series of processes are thereby completed. This embodiment allows eliminating the washing process or reducing a washing process time since it can control the application amount of the flux 3.

Figure 3A:
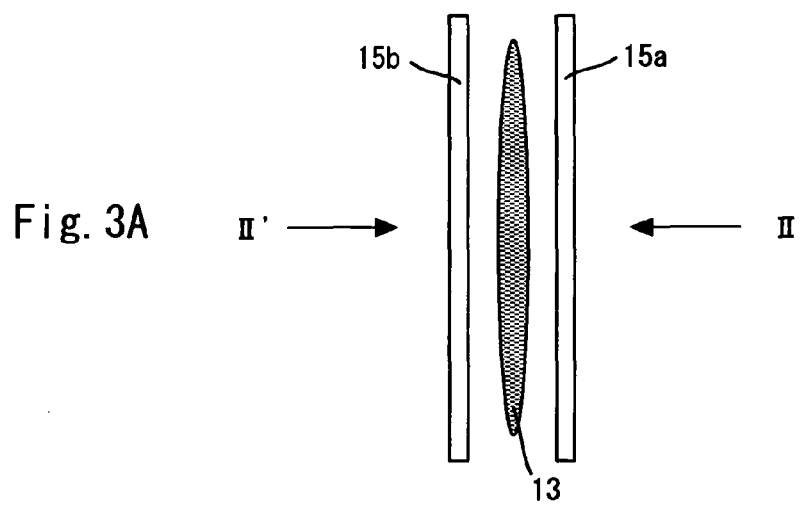
FIG. 3A is a view to describe a method of forming a desired thickness of viscous liquid.
Figure 3B:
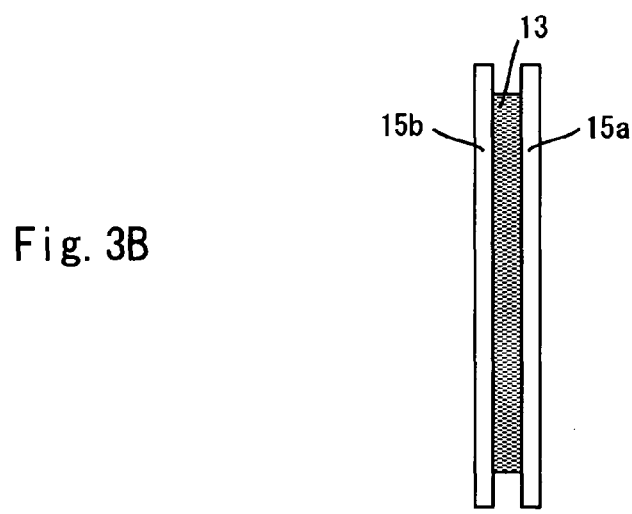
FIG. 3B is a view to describe a method of forming a desired thickness of viscous liquid.
Figure 3C:
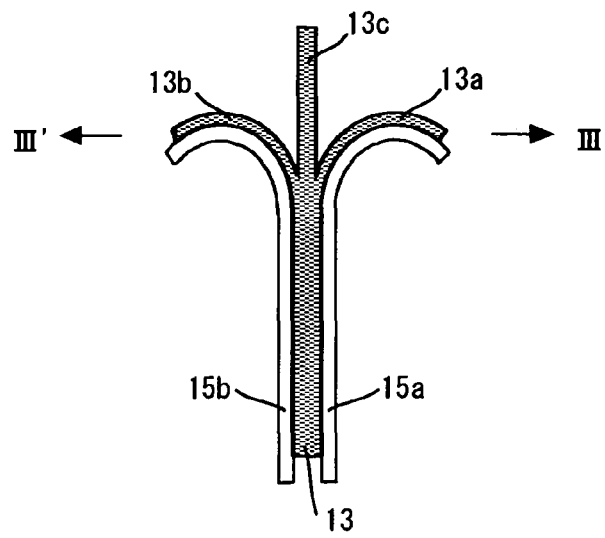
FIG. 3C is a view to describe a method of forming a desired thickness of viscous liquid.
Figure 4A:
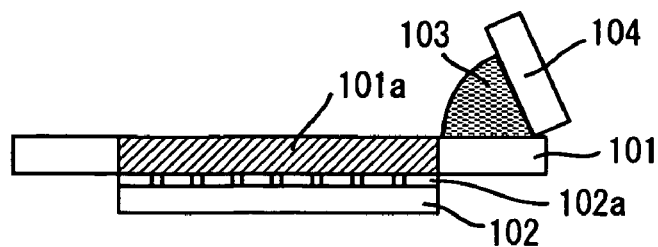
FIG. 4A is a process view to describe a method of applying flux according to an embodiment.
Figure 4B:
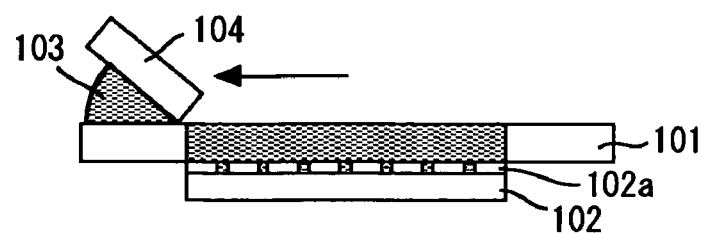
FIG. 4B is a process view to describe a method of applying flux according to an embodiment.
Figure 4C:
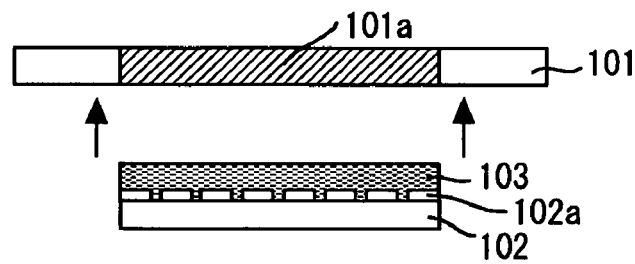
FIG. 4C is a process view to describe a method of applying flux according to an embodiment.
Figure 4D:
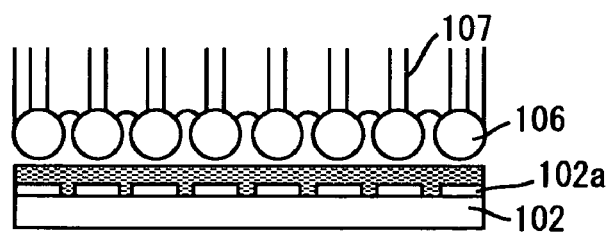
FIG. 4D is a process view to describe a method of applying flux according to an embodiment.
Figure 4E:
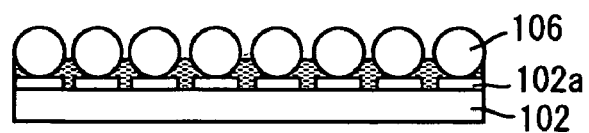
FIG. 4E is a process view to describe a method of applying flux according to an embodiment.
Figure 4F:
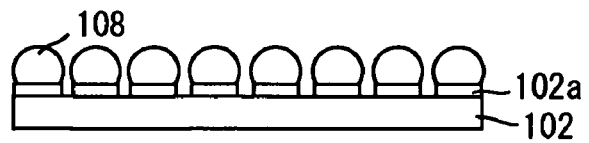
FIG. 4F is a process view to describe a method of applying flux according to an embodiment.
Figure 5A:
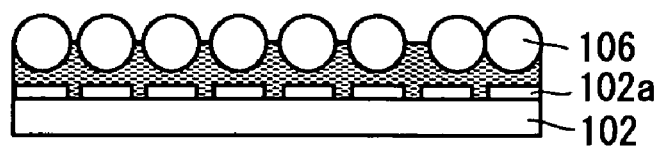
FIG. 5A is a process view to describe a problem in a method of applying flux according to a conventional technique.
Figure 5B:
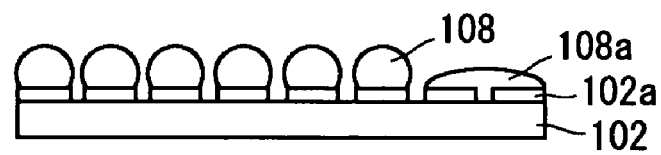
FIG. 5B is a process view to describe a problem in a method of applying flux according to a conventional technique.
Figure 5C:
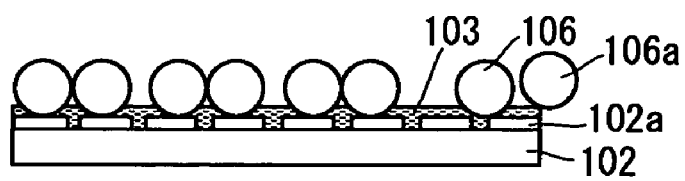
FIG. 5C is a process view to describe a problem in a method of applying flux according to a conventional technique.

Now, a way of forming a viscous liquid film with a desired thickness on a substrate is described hereinbelow with reference to FIGS. 3A to 3C. FIGS. 3A to 3C are views to describe a mechanism to apply a desired thickness of viscous liquid.

Referring first to FIG. 3A, a first coating material 15a and a second coating material 15b that are flexible at room temperature and viscous liquid 13 are prepared. The first coating material 15a and the second coating material 15b are moved in the directions of the arrows II and II', respectively, so that they closely sandwich the viscous liquid 13 as shown in FIG. 3B.

Referring then to FIG. 3C, the first coating material 15a and the second coating material 15b are separated from the viscous liquid 13 in the directions of the arrows III and III', respectively, at the same time. Since the coating materials 15a and 15b have a higher bonding strength with the molecules of the viscous liquid than an intermolecular bonding strength of the molecules of the viscous liquid, part of the viscous liquid 13 is attached to the first coating material 15a and the second coating material 15b. The viscous liquid attached to the first and second coating materials 15a and 15b are referred to herein as the viscous liquid 13a and 13b, respectively, which are substantially the same amount. The amount of the viscous liquid attached to the coating materials depends on the kind of the coating material and viscous liquid. The thickness of the viscous liquid left after stripping away the coating materials, which is viscous liquid 13c shown in FIG. 3C, is thereby equal to the initial application thickness minus the thickness of the viscous liquid attached onto the first and second coating materials 15a and 15b.

Using this technique, it is possible to apply a viscous liquid film having a desired thickness by applying viscous liquid thicker than a desired thickness onto a substrate, coating the viscous liquid closely with coating material and then stripping away the coating material to reduce the thickness of the viscous liquid. This method is particularly effective to form a thin film of viscous liquid, which has been difficult in conventional techniques.

The method of this embodiment allows applying flux with a desired thickness onto the principal surface of the semiconductor chip 2. Since the application thickness of the flux 3 is appropriate, it is possible to place the bump at an accurate position. This avoids a problem in bump formation by a solder ball such as electrical short-circuit due to contact between solder balls. Further, since no excess flux is left after reflow, it is possible to suppress occurrence of a problem or creation of a void in the resin sealing process even when a flux washing process is eliminated or a washing time is reduced. Furthermore, since this method is as simple as adhering covering material and then removing it, it allows cost reduction. This method also allows for reduction in the diameter or pitch of solder balls, thus having high versatility. Though it has been difficult to form a thin film by using the screen printing technique, this method enables to form a thin film.

Although the above embodiment describes the method of forming a bump on the principal surface of the semiconductor chip, the present invention is not limited thereto. The present invention may be applied to forming a bump for external connection on the principal surface of a circuit wiring board. Further, though the above embodiment describes the case where the viscous liquid is flux, the present invention may be applied to forming a desired thickness of any viscous liquid. The viscosity of viscous liquid used for this invention is preferably 1000 to 100 Pa-s, more preferably 400 to 200 Pa-s, and still more preferably 350 to 250 Pa-s. Though the above embodiment uses a mask for screen printing in the first process of applying viscous liquid onto a substrate, the present invention is not limited thereto, and known processes may be used as long as they do not deviate from the gist of the present invention.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A method of manufacturing a semiconductor apparatus, comprising:

disposing flux on a surface of a semiconductor substrate having plural electrodes formed thereon so that said flux goes between ones of said plural electrodes and overlies said plural electrodes;

placing a film comprising flexible material on the flux after disposing said flux;

stripping away the film together with part of the flux to reduce a thickness of the flux overlying the plural electrodes; and forming a respective bump on a surface of a corresponding one of the plural electrodes after stripping away the film, wherein said forming a respective bump comprises heat treating a solder ball to form said respective bump, said heat treating vaporizing said flux wherein said flux is intentionally thicker in the step of disposing flux than desired in the step of forming said respective bump.

2. The method of manufacturing a semiconductor apparatus according to claim 1, wherein the film is stripped substantially horizontally with respect to the surface of the substrate.

3. A method of forming a flux layer on a semiconductor substrate having a plurality of bumps, comprising in order:

disposing flux on a surface of a substrate having plural electrodes formed thereon so that said flux goes between ones of said plural electrodes and overlies said plural electrodes;

placing a film comprising flexible material on the flux;

stripping away the film together with part of the flux, so that part of the flux is left on the substrate with a reduced thickness of the flux overlying the plural electrodes; and forming a bump on the surface of a corresponding one of the plural electrodes where the flux is disposed by heat treating a solder ball to form said bump, said heat treating vaporizing said flux that is left on the substrate wherein said flux is intentionally thicker in the step of disposing flux than desired in the step of forming said respective bump.

4. The method of forming a flux layer on a substrate according to claim 3, wherein the film has a higher bonding strength with molecules of the flux than an intermolecular bonding strength of molecules of the flux.

5. The method of manufacturing a semiconductor substrate according to claim 1, wherein the film has a higher bonding strength with molecules of the flux than an intermolecular bonding strength of molecules of the flux.

6. A method of manufacturing a semiconductor apparatus, comprising:

disposing flux through a mask onto a surface of a semiconductor substrate having plural electrodes formed thereon so that said flux goes between ones of said plural electrodes and overlies said plural electrodes;

placing a film comprising flexible material on the flux overlying the plural electrodes, the film having a higher bonding strength with molecules of the flux than an intermolecular bonding strength of molecules of the flux;

stripping away the film together with part of the flux to reduce a thickness of the flux overlying the plural electrodes; and forming a respective bump on a surface of a corresponding one of the plural electrodes after stripping away the film, wherein said forming a respective bump comprises heat treating a solder ball to form said respective bump, said heat treating vaporizing said flux wherein said flux is intentionally thicker in the step of disposing flux than desired in the step of forming said respective bump.

7. The method of manufacturing a semiconductor apparatus according to claim 6, wherein the film is peeled back on itself and stripped substantially horizontally with respect to the surface of the substrate.

* * * * *